US005501150A

United States Patent [19]
Leenders et al.

[11] Patent Number: 5,501,150
[45] Date of Patent: Mar. 26, 1996

[54] PROCESS FOR THE PRODUCTION OF A PRINTING PLATE BY INKJET

[75] Inventors: Luc Leenders, Herentals; Leo Oelbrandt, Kruibeke; Jan Van den Bogaert, Schilde; Guido Desie, Herent, all of Belgium

[73] Assignee: Agfa-Gevaert, N.V., Mortsel, Belgium

[21] Appl. No.: 444,291

[22] Filed: May 18, 1995

[30] Foreign Application Priority Data

Jul. 11, 1994 [EP] European Pat. Off. ............ 94201994.4
Jan. 31, 1995 [EP] European Pat. Off. ............ 95200227.7

[51] Int. Cl.$^6$ ............... B41M 5/00; B41N 3/00; B05D 3/04; B05D 3/10
[52] U.S. Cl. .................... 101/466; 347/96; 427/261; 427/304; 430/204; 430/231
[58] Field of Search .................. 430/204; 101/466; 427/261, 283; 357/96

[56] References Cited

U.S. PATENT DOCUMENTS

| | | | |
|---|---|---|---|
| 4,003,312 | 1/1977 | Gunther | 101/466 |
| 4,668,533 | 5/1987 | Miller | 427/304 |
| 4,833,486 | 5/1989 | Zerillo | 101/466 |

*Primary Examiner*—Richard L. Schilling
*Attorney, Agent, or Firm*—Breiner & Breiner

[57] ABSTRACT

Process for the manufacture of a lithographic printing plate comprising the steps of:

(1) information-wise projecting droplets of liquid, onto a receiving material having a hydrophilic surface to form a silver image by bringing into working relationship on said hydrophilic surface a reducible silver compound (A), a reducing agent (B) for said silver compound and physical development nuclei (C) that catalyze the reduction of said silver compound to silver metal, and (2) hydrophobizing the silver image that has been obtained through said step (1) e.g. by overall contacting the printing surface with a hydrophobizing substance for said silver image or hydrophobizing said silver image by imagewise depositing said hydrophobizing substance thereon.

20 Claims, No Drawings

PROCESS FOR THE PRODUCTION OF A PRINTING PLATE BY INKJET

DESCRIPTION

1. Field of the Invention

The present invention relates to a process for the production of a lithographic printing plate by ink jet onto an image-receiving element containing a catalyst for image formation.

2. Background of the Invention

In lithography, being a planographic printing process, printing proceeds with an oleophilic ink using a printing form having a surface containing oleophilic ink-accepting image areas surrounded by an ink-repellant water-accepting background.

In the production of common photolithographic printing plates a support that has affinity to water or obtains such affinity by chemical treatment is coated with a thin layer of a photosensitive composition which shows or obtains affinity in the imaged areas for oily or greasy inks. Negative-working printing plates are obtained when the plates become ink receptive in the photo-exposed areas, and positive-working plates are obtained when the plates become ink-receptive in the non-exposed areas.

In many instances so-called presensitized plates are combined with a silver halide emulsion film intermediate that serves to form a mask in the exposure of the presensitized plate. A common presensitized plate contains e.g. an ultra-violet (UV) sensitive diazo compound in an alkali-soluble oleophilic binder layer on a hydrophilic support.

For many years film and plates have been used together very successfully but nowadays direct-to-plate systems have been developed in which such film intermediary becomes unnecessary.

In the book "Chemical Technology in Printing and Imaging Systems" Edited by J. A. G. Drake, published by The Royal Society of Chemistry, Thomas Graham House, Science Park, Cambridge, Great Britain (1993) a survey of direct to plate systems is given by P. J. Watkiss in the article titled: "A Review of Direct to Plate Systems in Lithographic Printing". From that article can be learned that "direct-to-plate" lithographic printing plates can be produced very successfully through the silver complex diffusion transfer reversal process.

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an informationwise exposed photographic silver halide emulsion layer material is transformed with a so-called silver halide solvent into soluble silver complex compounds that diffuse into an image receiving element and are reduced therein with a developing agent in the presence of physical development nuclei catalyzing the formation of a silver image having reversed image density values with respect to the silver image obtained in the exposed areas of said emulsion layer.

In a common direct-to-plate imaging by DTR-processing a single sheet, also called mono-sheet, assembly of a photographic silver halide emulsion layer integral with an image receiving layer in waterpermeable relationship therewith is used. The support of such an assembly may be a paper based product, a suitably hydrophilized resin sheet or web, e.g. a resin sheet coated with a thin aluminium layer, or a hydrophilic aluminium plate. The exposure of such plates may proceed from a computer stored electronic file the electronic signals of which are used to informationwise modulate a laser beam or the light of a light-emitting diode array.

When the physical development nuclei are coated onto a grained and anodised aluminium substrate, either or not in the presence of a hydrophilic waterpermeable binder, metallic silver formed by reduction of dissolved and diffusion-transferred silver complexes adheres very strongly to the substrate and forms an excellent lithographic printing surface upon chemical hydrophobization.

In one type of a mono-sheet DTR offset imaging element a hydrophilic support, mostly anodized aluminium, is coated in the order given with (1) physical development nuclei and (2) a silver halide emulsion layer. After informationwise photo-exposure and development, the imaged element is washed with water to remove the emulsion layer so that a support carrying a silver image is left. The silver image carried by the hydrophilic support is treated with a finishing liquid, also called fixer, that contains a hydrophobizing agent for improving the hydrophobicity of the silver image. Materials for producing printing plates in that way are described e.g. in U.S. Pat. No. 3,511,656 and published EP-A 0 410 500.

For the physical development of the silver images common organic reducing agents, e.g. hydroquinone, and silver halide complexing agents such as thiosulphate ions are supplied by the DTR-processing liquid.

The removal of the developed silver halide emulsion layer and optionally also of the hydrophilic colloid binder of the layer containing physical development nuclei is necessary to uncover the physically developed silver image on the printing plate substrate and proceeds e.g. by peeling off or by wash-off using a spray or jet of water.

Another technique for producing "direct-to-plate" lithographic printing plates is the ink-jet technology.

Nowadays ink jet printing has become one of the widely used non impact printing techniques. For fabricating lithographic printing plates ink jet printers may offer several advantages. One advantage is that such process is environmentally friendly since there is no use of potentially polluting chemical processing preparations and solvents applied in bulk from processing baths.

In Japanese patent application Kokai 62-25081 the use of an ink jet system for applying an oleophilic liquid to form an image on a hydrophilic aluminum surface for forming a lithographic printing plate is described.

In U.S. Pat. No. 4,833,486 a method for producing an instantaneous printing pattern is disclosed wherein a hot wax is deposited by ink jet onto the surface of an offset plate and solidifies by contact thereon. A disadvantage of non-cured oils and waxes is their poor durability whereby high printing runs of the order of e.g. 100,000 cannot be obtained.

In published (PCT) WO 94/11191 an apparatus for the production of lithographic plates, also called offset plates, by ink jet techniques has been proposed.

3. Objects and Summary of the Invention

It is an object of the present invention to provide a process for the production of a lithographic printing plate by means of an ink jet producing a strongly adhering hydrophobic image on a hydrophilic planographic printing base, which printing base will endure tens of thousands of printing runs.

It is another object of the present invention to provide a process for the production of a planographic printing form, which process does not include an overall application of chemically active processing liquid(s) to produce an oleophilic printing image.

Other objects and advantages of the present invention will become clear from the further description and examples.

In accordance with the present invention a process is provided for the manufacture of a lithographic printing plate comprising the steps of:

(1) information-wise projecting droplets of liquid, onto a receiving material having a hydrophilic surface thus bringing into working relationship on said hydrophilic surface a reducible silver compound (A), a reducing agent (B) for said silver compound and physical development nuclei (C) that catalyze the reduction of said silver compound to silver metal, and (2) hydrophobizing the silver image that has been obtained through said step (1) e.g. by overall contacting the printing surface with a hydrophobizing substance for said silver image or hydrophobizing said silver image by imagewise depositing said hydrophobizing substance thereon.

By the step "bringing into working relationship" is meant that when the droplets touch the image receiving material the ingredients (A), (B) and (C) are brought together so as to form a silver image by physical development. In this physical development a silver image is formed by means of dissolved silver ions that become reduced by a reducing agent in an oxidation-reduction reaction through catalytic action of physical development nuclei.

The physical development nuclei are preferably present on the receiving material before projecting thereon the droplets whereas either at least one member of silver compound (A) and reducing agent (B) is present in said droplets and the remaining member (if any) is present in said material or both members (A) and (B) are present in said material and alkali is present in said droplets.

The silver image formation preferably occurs in the presence of alkali. Further the reduction of the silver compound on the receiving material is speeded up optionally by heat applied to the image receiving material during and/or after deposition thereon of the droplets.

The following embodiments (i), (ii), (iii), (iv) and (v) are preferred embodiments of step (1) of the process according to the present invention.

(i) droplets containing silver compound (A) are projected imagewise onto the receiving material containing reducing agent (B) and physical development nuclei (C);

(ii) droplets containing reducing agent (B) are projected imagewise onto the receiving material containing silver compound (A) and physical development nuclei (C);

(iii) droplets containing (an) alkaline substance(s) giving the liquid a pH of at least 8 are projected imagewise onto the receiving material containing silver compound (A), reducing agent (B) and physical development nuclei (C);

(iv) a number of droplets containing compound (A) and a number of droplets containing reducing agent (B) are projected imagewise from different jets onto the receiving material containing physical development nuclei (C); and (v) droplets representing a physical developer by the presence of reducing agent (B) in admixture with reducible silver compound (A) that has been shielded against reduction but the reduction of which can take place in the presence of physical development nuclei, are projected imagewise onto the receiving material containing physical development nuclei (C).

In the receiving material the physical development nuclei may be present uniformly or in a patterned structure, the latter being interesting e.g. in the printing of identification documents.

4. Detailed Description of the Invention

A more detailed description will now be given of the invention and of preferred embodiments with regard to the ingredients of the receiving material to be transformed into a lithographic printing form and of the "liquid droplets" also referred to as "ink" applied in conjunction therewith.

In a preferred mode of the above embodiment (i) a water-based ink in which a reducible inorganic or organic silver compound is dissolved, is applied from ink-jet nozzles.

In a preferred mode of the above embodiment (ii) a water-based ink in which a reducing agent is dissolved, e.g. by means of alkaline substance(s), is applied from ink-jet nozzles.

In a preferred mode of the above embodiment (iv) a reducible silver compound and a reducing agent therefor are applied image-wise from distinct water-based inks to the receiving material from separate nozzles projecting the droplets in substantial congruency onto the receiving material.

In a preferred mode of the above embodiment (v) the ink is a waterbased stabilized physical developer containing a dissolved reducing agent in the presence of a silver salt the silver ions of which have been shielded from spontaneous nucleation (i.e. reduction) by reversing their surface charge with a cationic surfactant [ref. the book "Imaging Systems" by Kurt I. Jacobson—Ralph E. Jacobson—The Focal Press—London and New York (1976), p. 113]. In said book a composition of an aqueous stabilized physical developer containing ferrous ammonium sulphate as reducing agent for silver nitrate and having a pH of approximately 1.30 has been disclosed (see Table 5.2, page 113).

By water-based ink is to be understood that the carrier liquid of the ink is water or a mixture of water with (a) water-miscible organic solvent(s), e.g. acetone, containing the silver compounds in sufficiently divided state in order not to cause clogging of the nozzles of the ink jet apparatus.

It is preferred to use watersoluble inorganic silver salts in the process of the present invention. Particularly suitable watersoluble inorganic silver compounds are e.g. silver nitrate and complex salts of silver with ammonia, amines or thiosulfate or rhodanide (thiocyanate) ions.

Useful watersoluble organic silver compounds for application according to the present invention are silver acetate, silver lactate, silver salicylate and silver di-(2-ethylhexyl)sulphosuccinate; the preparation of the lastmentioned compound has been described in published European patent application 227 141.

The concentration of the silver compound in the ink droplets is preferably in the range of 0.1 mole/l to 6 mole/l. Low molecular weight silver compounds of high solubility in droplets thus permitting highly concentrated silver ion concentration like silver nitrate are preferred because they lead to high surface area concentration of silver metal formation per droplet.

A certain alkalinity is in favour of a rapid reduction of the silver ions. The pH of an ink containing the reducible silver compound in the absence of reducing agent is preferably in the range of 7.5 to 11. Where corrosion of the ink jet nozzles may form a problem the pH of the ink is preferably not higher than 8.

According to a particular embodiment the ink contains alkali-precursors that will set free an alkaline substance at elevated temperature, and/or alkaline substances are applied in the receiving material.

According to a particular embodiment the ink inherently has already an optical density by containing e.g. a black colorant or infra-red light absorbing substance or other colorant(s), In that case the optical density of the deposited colorant(s) is added to the optical density of the metal obtained by reduction such being in favour of the recognition of tiny halftone dots on the printing plate. For example, the optical density provided by the deposited colorant(s) is already in the range of 0.8 to 1.5.

As described in the book Imaging Information Storage Technology Edited by Wolfgang Gerhartz—VCH Weinheim—New York—Basel—Cambridge (1992) under the heading "1.13. Ink jet printing" many of the commercially available ink jet printers operate with water-based ink (see p. 43 of said book) by which is meant that such inks contain more than 70% by weight of water.

Small amounts of humectants such as glycols may be added to reduce the evaporation rate of the ink. For continuous ink jet printing the ink contains some salt in order to obtain a required electrical conductivity and chargeability for electrostatic deflection of the ink droplets. A water-soluble reducible silver salt as defined above, e.g. silver salt complex compound, will serve said purpose for increasing the electrical conductivity of the ink.

Water-based inks for use according to the present invention may contain a water-miscible solvent such as acetone, ethanol and methanol. Inks containing a major amount of watermiscible organic solvent(s) and that are particularly suited for use in thermal ink jet printers (a type of drop-on-demand ink jet printers) are described in detail in published European patent application 0 413 442. The solvents used have boiling points from about 50° C. to about 200° C. and are e.g. members of the following group: alkyl glycol ethers, wherein the alkyl group has up to 4 carbon atoms, alkyl pyrrolidinones, ketones and lactones.

According to one embodiment, e.g. for applying an organic silver salt or organic reducing agent, the ink may be free of water and contain solely organic solvent(s), preferably watermiscible polar solvents, e.g. acetone or methyl ethyl ketone, serving as solvent for the ingredients of the ink.

The rapid formation of silver metal deposit, is based on the catalytic action of nuclei contained in the receiving material, which nuclei show electron conductivity making them able to catalyze the reduction of metal compounds contained in physical developers [ref. the book "Imaging Systems" by Kurt I. Jacobson and Ralph E. Jacobson—The Focal Press, London and New York (1976), p.109].

The physical development nuclei used according to the present invention are preferably of the type known in silver complex diffusion transfer reversal (DTR) image receiving materials, also called "positive materials", wherein transferred silver complex compounds stemming from an image-wise exposed and developed silver halide emulsion material are reduced to silver metal [ref. Photographic Silver Halide Diffusion Processes" by André Rott and Edith Weyde—The Focal Press London and New York (1972), p. 54–57].

The physical development nuclei may be applied by common coating techniques using a liquid carrier vehicle, by spraying and even vapour deposition under vacuum conditions, e.g. by sputtering.

Preferred nuclei are colloidal noble metal particles, e.g. silver particles and colloidal heavy metal sulfide particles such as colloidal palladium sulfide, nickel sulfide and mixed silver-nickel sulfide. These nuclei may be present with or without waterpermeable binding agent on a very broad variety of supports having a hydrophilic surface. When used without waterpermeable binding agent they are applied preferably in the pores of a support, e.g. in the micro-pores of grained and anodized (eloxated) aluminium.

The incorporation of the development nuclei into that eloxated layer is done e.g. by immersing the eloxated aluminium foil or plate in an aqueous colloidal dispersion of development nuclei, e.g. colloidal silver or silver sulphide of nanometer size, that enters the pores of the eloxated layer and remain therein adhering on drying.

According to a particular embodiment they may be formed in situ with reactants contained in the ink and/or receiving material.

According to a particular technique said nuclei may be formed in situ in the pores or micro-cavities at the surface of the printing plate by coating said plate or immersing it into a solution of a heavy metal salt, e.g. lead acetate, and thereupon coating the plate with an aqueous solution of an alkali metal thiocyanate and a soluble sulfide, e.g. sodium sulfide (ref. U.S. Pat. No. 3,278,958 and GB-P 884,457).

The receiving layer may contain the physical development nuclei in operative contact with physical development accelerators, examples of which are thioether compounds described e.g. in published German patent application (DE-OS) 1,124,354, U.S. Pat. Nos. 4,013,471; 4,072,526 and published European patent allication (EP-A) 0,26,520.

In the embodiment wherein the reducible silver salt is applied by ink jet [see the hereinbefore mentioned embodiment (i)] the development nuclei and reducing agent(s) are present in the same layer or in different layers but in ink-permeable relationship with each other.

A receiving layer for use according to the hereinbefore described embodiment (i) may contain an oxidation inhibiting compound preventing premature oxidation of the uniformly present reducing agent(s). For that purpose are mentioned e.g. sulfite compounds that may raise at the same time the alkalinity. Further are mentioned the oxidation inhibitors described in GB-P 1,182,198, e.g. the ammonium salt of a hydroxyl-substituted polybasic aliphatic acid such as tartaric acid and citric acid and saccharides.

In the embodiment (ii) wherein the reducing agent is applied by ink jet nozzles the development nuclei and reducible silver compound(s), optionally in the presence of a silver complexing compound such as thiosulphate, are present in the same layer or in different layers but in ink-permeable relationship with each other, so that the silver ions can reach by diffusion the colloidal non-migratory development nuclei that in said embodiment are present in an outermost layer.

The silver compound present in the receiving material is e.g. a silver halide, applied as a dispersion, also called emulsion, in a hydrophilic colloid binder layer. The light-sensitivity of said silver halide does not matter, but preferably for rapid dissolution of the silver halide by thiosulfate ions as silver solvent, a fine grain silver chloride emulsion is used as a silver source. Photographic materials for the preparation of printing plates that may be used as receiving materials in the embodiment (ii) of the process of the present invention are described e.g. in U.S. Pat. No. 3,721,559 (De Haes et al.), and 3,904,412 (Serien et al.), wherein also suitable processing liquids containing organic reducing agents suitable for use as ink in the present embodiment (ii) are described. Further said U.S.-P documents contain examples of suitable "lithographic fixer" liquids, also called "fix solution" for the hydrophobization of the obtained silver image.

In the embodiment (iii) wherein an alkaline substance is applied by ink jet the development nuclei, the reducing agent and reducible silver compound(s), optionally in the presence of a silver complexing compound such as thiosulphate, are present in different layers but in ink-permeable relationship with each other, so that the silver ions can reach by diffusion the colloidal diffusion-resistant development nuclei that in such embodiment are present in an outermost layer.

A photographic material that may serve in the embodiment (iii) for the production of a lithographic printing form by ink jet is shown in FIG. 4.26 on page 123 of the already mentioned book "Photographic Silver Halide Diffusion Processes" by André Rott and Edith Weyde and defined therein as a RAPILITH (tradename of Agfa-Gevaert N.V.) monosheet material for the production of lithographic plates suited for offset printing.

Said RAPILITH (tradename) monosheet material comprises a paper support coated in successive order with (A) a silver halide emulsion containing developing agents, (B) a hardened hydrophilic colloid, (e.g. a still waterpermeable hardened gelatin layer) and (C) an outermost layer containing physical development nuclei. Such monosheet material and the hydrophobization of the silver image obtained thereon is described in more details in U.S. Pat. No. 3,676,125, which document also contains information about the composition of suitable alkaline liquids that can be used as ink in embodiment (iii) of the process according to the present invention. Further U.S. Pat. No. 3,676,125 contains a description of a "fixer" for hydrophobizing the obtained silver image in the physical development nuclei-containing top coat of the image-receiving material.

The coverage of development nuclei in and/or on top of the receiving material may vary widely according to the type of nuclei, but is situated e.g. in the range of 0.01 mg to 100 mg per m$^2$.

The alkaline substances used in the ink of embodiment (iii) have not necessarily to be of inorganic nature. Good results may be obtained with organic alkaline substances such as alkanolamines described e.g. in U.S. Pat. No. 5,162,192.

The reducing agent(s) applied in the ink or ink-receiving material may be any kind of developing agent used in silver halide photography and more particularly in silver complex diffusion transfer reversal (DTR-) processing.

According to a particular embodiment a mixture of synergistically active reducing agents is used. For example, as main reducing agent a polyhydroxy-benzene type reducing agent, e.g. hydroquinone-type reducing agent, is combined with a secondary developing agent of the class of 1-phenyl-3-pyrazolidinone compounds and/or N-methyl-aminophenol compounds. For example, a synergistic mixture of developing agents as described in GB-P 989,383, 1,003,783 or 1,191,535 is used.

According to a special embodiment the ink and/or ink receiving layer may contain a reducing agent that is poorly active at normal temperature but becomes more active at elevated temperature.

Examples of particularly weak reducing agents are sterically hindered phenols as described e.g. in U.S. Pat. No. 4,001,026 or leuco dyes that on oxidation form a dye, e.g. an indoaniline or azomethine dye.

The ratio by weight of binder to reducing agent(s) is preferably in the range of 0.2 to 6 and the thickness of the ink receiving layer is preferably in the range of 1 to 20 µm.

As stated already above the reduction of silver compounds deposited by ink jet is speeded up in alkaline medium. For that purpose the ink image receiving material may contain an alkaline substance or substances by means of which in situ, e.g with one or more substances contained in the ink, hydroxyl ions (HO$^-$) can be formed. Suitable "in situ" alkali-generating compounds are described in U.S. Pat. No. 3,260,598, in published EP-A 0210659, and U.S. Pat. No. 5,200,295. For example, zinc hydroxide is contained in the recording material and ethylenedinitrilo tetraacetate (EDTA) or a picolinate is contained in the ink.

Sodium hydroxide as strong base will be formed in situ at the place of ink deposit when the reducing agent is hydroquinone forming by oxidation a quinone reacting with water of the ink and sodium sulfite contained in the ink-receiving layer to raise the alkalinity and development rate in the area of silver deposit [ref. "A Textbook of Photographic Chemistry" by D. H. O. John and G. T. J. Field—Chapman and Hall LtD Londo (1963), p.75]. Further is mentioned the formation of sodium hydroxide in situ by reaction of an aldehyde such as formaldehyde or ketone, e.g. as acetone, with sodium sulfite (see the same Textbook p. 78).

According to a special embodiment the recording material contains for application in the hereinbefore described embodiment (i) together with the necessary reducing agent(s) a thermosensitive base releasing agent (alkali-precursor) that after image-wise ink deposition and by overall heating of the recording material will set free an alkaline substance, e.g. an amine. Heating may proceed by contact with hot bodies, micro-waves produced by magnetron or by infrared light absorbed in the silver image areas.

Thermosensitive base-releasing agents are e.g. guanidine-trichloro-acetate described e.g. in GB-P 998,949. The thermosensitive base-releasing agents may be incorporated in a water-permeable layer being in contact with the water-permeable imaging layer containing the reducing agent(s) and nuclei for silver image formation.

The viscosity of the ink will be adapted to the type of ink jet apparatus used. For increasing the viscosity water-soluble polymeric compounds, e.g. polyvinyl pyrrolidone, may be used. A decrease of viscosity may be obtained by means of surface active agents also serving as wetting agents for the ink-receiving layer.

The use of cationic surface active agents in the ink applied according to the hereinbefore mentioned embodiment (v) prevents spontaneous nucleation from taking place in the ink containing silver ions and a reducing agent. However, the surfactant may not prevent physical development with physical development nuclei situated in the ink-receiving material.

As described in periodical PS & E, Vol. 13, Number 2, March–April 1969, page 40 dodecylamine acetate in combination with a non-ionic surfactant (LISSAPOL N—tradename of ICI) yields preferred physical developers containing silver nitrate as silver source and METOL (tradename) as reducing agent.

In step (2) of the process of the present invention the silver image must be rendered sufficiently hydrophobic in order to accept an oily or grease-type ink used in lithographic printing.

The silver can be rendered hydrophobic by different methods which include at least superficial oxidation, e.g. by means of potassium hexacyanoferrate(III). After oxidation, the silver image can be converted by means of organic compounds containing SH, SeH, OH or NH-groups, into sparingly water-soluble compounds, e.g. silver thiolates, having a strong hydrophobic character. Said treatment may take place in the presence of a fatty acid e.g. oleic acid (ref. U.S. Pat. No. 3,676,125). According to U.S. Pat. No. 3,904,412 a suitable lithographic fixer, which may be used in the present invention, contains:

1. an iron(III) ammonium salt of an aliphatic dicarboxylic acid as oxidizing agent for the silver image,
2. a precipitating agent for silver ions, and
3. an organic nitrogen-containing compound having a thiol group or in its tautomeric structure a thione group as represented in the following structural parts:

The lithographic fixer may further contain a compound improving the hydrophilic charater of the non-printing parts, phosphoric acid especially for aluminium plates and a polyol, e..g. glycerol, or polyethylene glycol for a hardened hydrophilic colloid layer containing physical development nuclei as described in U.S. Pat. No. 3,904,412.

The lithographic fixer may be applied by ink jet either overall or imagewise in congruency with the formed silver image e.g. at a coarser resolution.

In order to further strenghten the hydrophobicity of the silver image and to increase the durability of the printing parts for higher printing runs, especially when using on aluminium base, the printing plate may be rubbed with a dissolved hydrophobic lacquer using a plug of wadding. Suitable hydrophobic protective lacquers are described in FR-P 1,290,784.

In the preparation of a lithographic printing form according to the present invention a hydrophilic base is used that after having been covered with the hydrophobized silver image forms the hydrophilic non-printing areas.

According to a first particularly useful embodiment said hydrophilic base is a hydrophilic metallic sheet e.g. an aluminium support sheet.

Such aluminum support may be made of pure aluminum or of an aluminum alloy, the aluminum content of which is at least 95%. The thickness of that support usually ranges from about 0.13 to about 0.50 mm.

The preparation of aluminum or aluminum alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results. Preferably the aluminum foil has a roughness with a mean value between 0.2 and 1.5 µm, an anodization layer with a thickness between 0.4 and 2.0 µm and is sealed with an aqueous bicarbonate solution.

The roughening of the aluminum foil can be performed according to methods well known in the prior art for that purpose. The surface of the aluminum substrate can be toughened either by mechanical, chemical or electrochemical graining or by a combination of these to obtain a satisfactory adhesiveness to physical development nuclei and deposited silver and to provide a good water retention property to the areas that will form the non-printing areas on the plate surface.

Electrochemical graining is preferred because it can form a uniform surface roughness having a large average surface area with a very fine and even grain which is desired when used for lithographic printing plates of high image resolution.

Electrochemical graining can be conducted in a hydrochloric and/or nitric acid containing electrolyte solution using an alternating or direct current. Other aqueous solutions that can be used in the electrochemical graining are e.g. acids like HCl, $HNO_3$, $H_2SO_2$. $H_3PO_4$, that if desired, contain additionally one or more corrosion inhibitors such as $Al(NO_3)_3$, $AlCl_3$, boric acid, chromic acid, sulfates, chlorides, nitrates, monoamines, diamines, aldehydes, phosphates and $H_2O_2$.

Electrochemical graining can be performed using single-phase and three-phase alternating current. The voltage applied to the aluminum plate is preferably 10–35 V. A current density of 3–150 $Amp/dm^2$ is employed for 5–240 seconds. The temperature of the electrolytic graining solution may vary from 5°–50° C. Electrochemical graining is carried out preferably with an alternating current from 10 Hz to 300 Hz.

The roughening is preferably preceded by a degreasing treatment mainly for removing fatty substances from the surface of the aluminum foil. Therefore the aluminum foil may be subjected to a degreasing treatment with a surfactant and/or an aqueous alkaline solution.

Preferably toughening is followed by a chemical etching step using an aqueous solution containing an acid. The chemical etching is preferably carried out at a temperature of at least 30° C. more preferably at least 40° C. and most preferably at least 50° C.

Suitable acids for use in the aqueous etch solution are preferably inorganic acids and most preferably strong acids. The total amount of acid in the aqueous etch solution is preferably at least 150 g/l. The duration of chemical etching is preferably between 3 s and 5 min.

After roughening and optional chemical etching the aluminum foil is anodized which may be carried out as follows.

An electric current is passed through the grained aluminum foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70% by weight can be used within a temperature range from 0°–70° C. The anodic current density may vary from 1–50 $A/dm^2$ and a voltage within the range 1–100 V to obtain an anodized film weight of 1–8 $g/m^2$ $Al_2O_3.H_2O$. The anodized aluminum foil may subsequently be rinsed with demineralised water within a temperature range of 10°–80° C.

After the anodizing step sealing may be applied to the anodic surface. Sealing of the pores of the aluminum oxide layer formed by anodization is a technique known to those skilled in the art of aluminum anodization. This technique has been described in e.g. the periodical "Belgisch-Nederlands tijdschrift voor Oppervlaktetechnieken van materialen", 24ste jaargang/januari 1980, under the title "Sealingkwaliteit en sealing-controle van geanodiseerd Aluminum". Different types of sealing of the porous anodized aluminum surface exist.

Preferably, said sealing is performed by treating a grained and anodized aluminum support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

According to a second particularly useful embodiment said hydrophilic base is a flexible resin base superficially hydrophilized or coated with a hydrophilic layer, e.g. a layer containing a hardened hydrophilic binder resin or polymeric colloid binder.

Suitable binders for the ink receiving layer(s) are hydrophilic water-soluble polymers wherein the development nuclei and reducing agent(s) can be applied uniformly from aqueous medium.

The hydrophilic binder of the ink receiving layer(s) may be any hydrophilic water-soluble polymeric binder used in the preparation of photographic silver halide emulsion layers.

Preferred are protein-type binding agents such as gelatin, casein, collagen, albumin, or gelatin derivative, e.g. acetylated gelatin. Other suitable water-soluble binding agents are: polyvinyl alcohol, dextran, gum arabic, zein, agar-agar, arrowroot, pectin, carboxymethyl cellulose, hydroxyethyl cellulose, poly(acrylic acid), and polyvinylpyrrolidone that may be used in admixture.

Preferred hardened hydrophilic layers comprise partially modified dextrans or pullulan hardened with an aldehyde as disclosed in e.g. EP-A 514,990 which therefor is incorporated herein by reference. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. No. 3,971,660, U.S. Pat. No. 4,284,705, EP-A 405,016 and EP-A 450,199 which therefor are incorporated herein by reference.

A particularly suitable hydrophilic layer is a layer of polyvinyl alcohol hardened with tetramethylorthosilicate or tetraethylorthosilicate containing $TiO_2$, wherein the weight ratio between said polyvinylalcohol and said tetramethylorthosilicate or tetraethylorthosilicate is between 0.8 and 2 and wherein the weight ratio between said polyvinylalcohol and said titaniumdioxide is preferably not higher than 1. Such hydrophilic binders are disclosed e.g. in published EP-A 0 619 524, which therefor is incorporated herein by reference.

The polymers or mixtures thereof forming the binder of the ink-image receiving layer may be used in conjunction with swelling agents or "heat solvents" also called "thermal solvents" or "thermosolvents" improving the reaction speed of the redox-reaction between silver compound and organic reducing agent at elevated temperature.

By the term "heat solvent" in this invention is meant a non-hydrolyzable organic material which is in solid state at temperatures below 50° C. but becomes on heating above that temperature a plasticizer for the binder of the layer wherein they are incorporated and possibly act then also as a solvent for the organic reducing agent.

Thermal solvents having a dielectric constant of at least 10 are preferred. Particularly useful are polyethylene glycols having a mean molecular weight in the range of 1,500 to 20,000 described in U.S. Pat. No. 3,347,675. Further are mentioned compounds such as urea, methyl sulfonamide and ethylene carbonate being heat solvents described in U.S. Pat. No. 3,667,959, and compounds such as tetrahydrothiophene-1,1-dioxide, methyl anisate and 1,10-decanediol being described as heat solvents in Research Disclosure, December 1976, (item 15027) pages 26–28. Still other examples of heat solvents have been described in U.S. Pat. No. 3,438,776, and 4,740,446, and in published EP-A 0 119 615 and 0 122 512 and DE-A 3 339 810.

Gelatin and such polymers that can be applied to form the ink image receiving layer from an aqueous solution may be hardened up to a certain degree wihout destroying their permeability with respect to aqueous liquids. A survey of such binders is given in Research Disclosure November 1989, item 307105 in the chapter IX. "Vehicles and vehicle extenders" and for suitable hardening agents reference is made to chapter X. "Hardeners".

The ink-image receiving layer(s) is (are) commonly coated from an aqueous medium containing a hydrophilic colloid binder in dissolved form but may be applied from aqueous medium containing a hydrophilic water-soluble polymer, e.g. gelatin, in admixture with a dispersed polymer (latex) that may have hydrophilic functionality. Polymers with hydrophilic functionality for forming an aqueous polymer dispersion (latex) are described e.g. in U.S. Pat. No. 5,006,451.

Ink-image receiving layers may further contain antistatic agents, e.g. non-ionic antistatic agents including a fluorocarbon group as e.g. in $F_3C(CF_2)_6CONH(CH_2CH_2O)$—H, plasticizers, friction reducing compounds e.g. in the form of particles protruding from the recording layer, e.g. talc particles and polymer beads with low friction coefficient, and transparent inorganic pigments, e.g. colloidal silica.

Supports for forming a printing plate are preferably flexible so that they can be braced on a printing cylinder.

The flexible supports may be opaque or transparent, e.g. a paper support or a resin support. When a paper support is used preference is given to one coated at one or both sides with an Alpha-olefin polymer, e.g. a polyethylene layer. Preferably an organic resin support is used e.g. cellulose esters such as cellulose acetate, cellulose propionate and cellulose butyrate; polyesters such as poly(ethylene terephthalate); polyvinyl acetals, polystyrene, polycarbonate: polyvinylchloride or poly-Alpha-olefins such as polyethylene or polypropylene.

One or more subbing layers may be coated between the flexible hydrophobic support and the hydrophilic layer for use in accordance with the present invention in order to get an improved adhesion between these two layers.

A preferred subbing layer for use in connection with the present invention, is a subbing layer which is contiguous to the hydrophilic layer and contains gelatin and silica.

In the process of the present invention any kind of ink jet printer may be used. Image-wise deposition of ink may proceed by separate, not-overlapping drops or by several drops at least partly in superposition. Drop-on-demand ink jet printers are preferred when demands on resolution are not particularly stringent as e.g. for printing bar code information.

For high resolution purposes and high quality graphic art reproductions preference is given to continuous ink jet printers in which e.g. a 10 micron jet of ink is continuously ejected from a nozzle. By stimulating the nozzle with a piezo-electric crystal the jet breaks up into about 1 million equally sized drops per second. Each individual drop can be on-off controlled by means of electric charging and deflection at the point of drop formation. When they enter a static electric field charged drops will be caught under a knife edge, whereas uncharged drops will reach the ink image receiving material which is normally fastened on a drum. A spatial printing resolution of about 10 pixels/mm can be obtained easily and it is possible to create up to 32 different density levels for each pixel by dot size control. This is accomplished by depositing from 0 to 32 different density levels for building each pixel. A combination of these discrete density levels over a small area of adjacent pixels using a mixing algorithm, called dithering, yields the possibility to produce density levels represented by pixel values, e.g. from 0 to 255.

By "dithering" is meant that halftone cells, called halftone dots, are divided into a pattern formed by tiny spots (pixels) arranged in different number and geometrically different.

According to a special embodiment a multiple, e.g. duo ink jet, is used by means of which ink droplets, e.g. one group containing dissolved silver salt and the other group containing reducing agent and/or alkaline substance(s) merge before or on reaching the ink receiving material. Ink jet printers with merging ink droplets are described in late Deutsche Demokratische Republik (DD) Patentschriften 218 041, 221 691 and 223 672.

According to a particular embodiment separate ink jets apply inks of different concentration of silver compound or reducing agent. According to another embodiment that may be combined with the preceding embodiment the amount of deposited ink is varied pixelwise.

The following example illustrates the present invention. The percentages, ratios and parts are by weight unless otherwise indicated.

EXAMPLE

Preparation of the Ink

To an aqueous 6 molar silver nitrate solution ammonium hydroxide was added up to pH 10 so as to obtain a 3 molar ammonia-silver nitrate complex solution. Three parts of said solution were diluted with 10 parts of distilled water and said diluted solution was introduced into a Hewlett-Packard (HP) deskjet ink-cassette for use in a HP-DeskJet Plus (tradename) inkier apparatus.

Printing Plate Material 1

A grained and anodized aluminium base having a thickness of 175 μm was coated with an aqueous dispersion of PdS development nuclei in conjunction with a minor amount of gelatin as protective colloid. Onto the dried development nuclei-containing layer was coated a 6.7% aqueous solution of ethyl gallate using a BRAIVE coating knife set at 40 μm from the substrate so as to obtain a coverage of 2.67 g/m$^2$ of ethyl gallate.

Printing Plate Material 2

A subbed polyethylene terephthalate film having a thickness of 100 μm and coated with a hydrophilic layer H as described hereinafter was provided with a dried hydrophilic colloid layer containing 4.1 mg/m$^2$ of colloidal PdS development nuclei, 3.9 g/m$^2$ of polyvinyl alcohol and 1.3 mg/m$^2$ of diisooctylsulfosuccinate sodium salt as wetting agent.

Onto the dried development nuclei-containing layer was coated a 6.7% aqueous solution of ethyl gallate using a BRAIVE coating knife set at 40 μm from the substrate so as to obtain a coverage of 2.67 g/m$^2$ of ethyl gallate.

Composition of the hydrophilic layer H (g/m$^2$)

| | |
|---|---|
| Titanium dioxide filler | 7.27 |
| Polyvinyl alcohol | 0.90 |
| Si(OCH$_3$)$_4$ | 1.86 |
| glycerol | 0.16 |
| colloidal PdS | 0.016 |
| saponine | 0.08 |
| HOSTAPON T (tradename) wetting agent | 0.08 |

Preparation of the Printing Plates

Onto the printing plate materials 1 and 2 a silver metal image was formed using a HP DeskJet Plus (tradename) ink jet printer containing in its inkcassette the above defined ink. The imaging was in conformity with electronic signals corresponding with digital printing data controlled by ADOBE (tradename) photoshop software.

The silver image areas were made oleophilic and lithographic ink receptive by spraying onto the imaged surfaces the following lithographic fixer composition:

| | |
|---|---|
| demineralized water | 450 ml |
| sodium nitrite | 5 g |
| trisodium orthophosphate. 12 water | 40 g |
| potassium hexacyanoferrate (III) | 98 g |
| tributyl phosphate | 1 ml |
| ethylene glycol monoacetate | 100 ml |
| n-propanol | 150 ml |
| 1-allyl-2-imidazolidine-thion | 5.2 g |
| methoxypropanol | 52 ml |
| demineralized water up to | 1000 ml |

Offset-Printing and Results

The printing plates 1 and 2 prepared as described above were mounted on a commercial offset printing apparatus A. B. Dick 350 CD (tradename) provided with classical dampening system in which the imaged surface of the plates was brought into contact with a fatty printing ink as described in Example 1 of U.S. Pat. No. 3,989,522. Said fatty printing ink is a conventional offset printing ink as described in the book "Printing Ink Technology" by E. A. Apps, Leonard Hill [Books] Limited, Edenstreet, London, N.W. 1 (1961) on page 348, on the basis of an oxidatively drying styrenated linseed-tung oil alkyd resin in aliphatic petroleum having a boiling range of 260°–290° C. containing a red azopigment LAKE RED (C.I. 15,585) and as oxidative drying catalyst a mixture of lead and cobalt naphthenate.

Offset printing with said fatty ink resulted already from the first print in a good ink acceptance and did not result in ink-offsetting on non-image areas.

We claim:

1. Process for the manufacture of a lithographic printing plate comprising the steps of:

(1) information-wise projecting droplets of liquid onto a receiving material having a hydrophilic surface thus bringing into working relationship on said hydrophilic surface a reducible silver compound (A), a reducing agent (B) for said silver compound and physical development nuclei (C) that catalyze the reduction of said silver compound to silver metal, and (2) hydrophobizing the silver image that has been obtained through said step (1).

2. Process according to claim 1, wherein hydrophobizing of the silver image is performed by overall contacting the printing surface with a hydrophobizing substance for said silver image or hydrophobizing said silver image by imagewise depositing said hydrophobizing substance on said silver image.

3. Process according to claim 1, wherein said physical development nuclei are present on the receiving material and either at least one member of said silver compound (A) and said reducing agent (B) is present in said droplets and the remaining member (if any) is present in said material, or both said silver compound (A) and said reducing agent (B) are present in said material and alkali is present in said droplets.

4. Process according to claim 1, wherein said droplets contain said silver compound (A) and are projected imagewise onto said receiving material containing said reducing agent (B) and said physical development nuclei.

5. Process according to claim 1, wherein said droplets contain reducing agent (B) and are projected imagewise onto said receiving material containing said silver compound (A) and said physical development nuclei (C).

6. Process according to claim 1, wherein said droplets contain (an) alkalie substance(s) giving the droplets a pH of at least 8 and are projected imagewise onto said receiving material containing said silver compound (A), said reducing agent (B) and said physical development nuclei (C).

7. Process according to claim 1, wherein a number of said droplets contain said compound (A) and a number of said droplets contain said reducing agent (B) and are projected imagewise from different jets onto said receiving material containing said physical development nuclei (C).

8. Process according to claim 1, wherein said droplets represent a physical developer by the presence therein of said reducing agent (B) in admixture with said reducible silver compound (A) that has been shielded against reduction but the reduction of which can take place in the presence of physical development nuclei, and said droplets are projected imagewise onto said receiving material containing said physical development nuclei (C).

9. Process according to claim 1, wherein said silver compound is a water-soluble inorganic or organic silver compound.

10. Process according to claim 9, wherein said silver compound is selected from the group consisting of silver nitrate, silver di(2-ethylhexyl)-sulphosuccinate, and a complex salt of silver with ammonia, an amine, thiosulfate or thiocyanate ions.

11. Process according to claim 4, wherein said silver compound is present in the droplets in the range of 0.1 mole/l to 6 mole/l.

12. Process according to claim 1, wherein the droplets have a pH in the range of 8 to 11.

13. Process according to claim 7, wherein said reducible silver compound and said reducing agent therefor are applied image-wise from distinct water-based droplets to the receiving material from separate nozzles projecting the droplets in substantial congruency onto the receiving material.

14. Process according to claim 1, wherein said physical development nuclei are of the kind applied in silver complex diffusion transfer reversal (DTR-) processing.

15. Process according to claim 14, wherein said physical development nuclei are colloidal noble metal particles or colloidal heavy metal sulfide particles.

16. Process according to claim 14, wherein said physical development nuclei are present in and/or on top of a receiving layer of said receiving material at a coverage in the range of 0.01 mg to 1000 mg per $m^2$.

17. Process according to claim 4, wherein said physical development nuclei and reducing agent(s) are contained in a film-forming binder that is permeable for the droplets, or swellable by water and/or the organic watermiscible solvent(s) contained in the droplets.

18. Process according to claim 1, wherein the receiving material contains a receiving layer containing a protein binding agent, polyvinyl alcohol, dextran, gum arabic, zein, agar-agar, arrowroot, pectin, carboxymethyl cellulose, hydroxyethyl cellulose, poly(acrylic acid), polyvinylpyrrolidone or mixtures thereof, either or not in hardened but still hydrophilic form.

19. Process according to claim 1, wherein said reducing agent is one known from silver diffusion transfer reversal (DTR-) processing.

20. Process according to claim 4, wherein said receiving material contains a receiving layer containing a binder and said reducing agent wherein the weight ratio of binder to reducing agent(s) is in the range of 0.2 to 6, and the thickness of the receiving layer is in the range of 1 to 20 μm.

* * * * *